United States Patent [19]

Scifres et al.

[11] Patent Number: 5,282,080
[45] Date of Patent: Jan. 25, 1994

[54] SURFACE COUPLED OPTICAL AMPLIFIER

[75] Inventors: Donald R. Scifres; David F. Welch, both of San Jose, Calif.

[73] Assignee: SDL, Inc., San Jose, Calif.

[21] Appl. No.: 804,784

[22] Filed: Dec. 9, 1991

[51] Int. Cl.$^5$ ............................................. H01S 3/18
[52] U.S. Cl. .................................... 359/344; 372/45
[58] Field of Search ..................... 359/344, 346, 333; 372/45, 46, 108, 43

[56] References Cited

U.S. PATENT DOCUMENTS

| | | | |
|---|---|---|---|
| 3,465,159 | 9/1969 | Stern | 359/344 |
| 3,621,459 | 11/1971 | Reeves | 359/344 |
| 3,996,492 | 12/1976 | McGroddy | 372/93 |
| 4,163,953 | 8/1979 | Springthorpe et al. | 372/45 |
| 4,194,162 | 3/1980 | Uematsu et al. | 359/344 |
| 4,821,276 | 4/1989 | Alphonse et al. | 372/45 |
| 4,872,180 | 10/1989 | Rideout et al. | 372/108 |
| 4,881,236 | 11/1989 | Brueck et al. | 372/45 |
| 4,896,195 | 1/1990 | Jansen et al. | 357/17 |
| 4,993,799 | 2/1991 | Stein | 385/33 |
| 5,019,787 | 5/1991 | Carlson et al. | 359/344 |
| 5,026,138 | 6/1991 | Boudreau et al. | 385/51 |
| 5,119,039 | 6/1992 | Olshansky et al. | 359/346 |

OTHER PUBLICATIONS

"Polarisation-Independent Optical Amplifier with Buried Facets", Electronics Letters, vol. 25, No. 15, pp. 1048-1049, Aug. 3, 1989.

Salzman et al., "Modal Coupling in tilted . . . Amplifiers," Jun. 1988, Optics Letters, vol. 13, #6, pp. 455-457.

Zah et al., "1.3 um GaInAsP Near Travelling Wave Laser Amplifiers made by combination of Angled Facets and Antireflection Coatings," Electronics Letters, vol. 24, #20, Sep. 1988, pp. 1270-1276.

Primary Examiner—Ian J. Lobo
Attorney, Agent, or Firm—Schneck & McHugh

[57] ABSTRACT

An optical amplifier with at least one high reflectivity facet oriented at a nonperpendicular angle to the amplifier's waveguide to couple light vertically through a top or bottom surface of the amplifier. Angled facets could be at just one end of the waveguide or at both ends of the waveguide. In the latter case, the facets can be approximately parallel to or perpendicular to each other for respective coupling to opposite or same sides of the amplifier. Multiple amplifiers can be formed end-to-and with v-grooves defining the angled facets or can be formed side-by-side with parallel waveguides. Waveguides can also branch to form a 1:2, 1:4 or 2:2 optical signal multiplier or optical switch depending on whether just one or all of the waveguide branches are electrically pumped. Fibers are coupled to the amplifier receiving and emitting surfaces. Angling the fiber end with respect to the surface prevents reflections from feeding back into the amplifier waveguide. The facets can also be oriented at an angle other than 45° to direct the light out of the surface at a nonperpendicular angle.

17 Claims, 7 Drawing Sheets

SURFACE COUPLED OPTICAL AMPLIFIER

DESCRIPTION

1. Technical Field

The present invention relates to semiconductor diode amplifiers for optical signals.

2. Background Art

In the field of lightwave communications, in which an optical signal is transmitted along optical fiber waveguides, a series of repeater or relay stations are required at regular intervals to reradiate the signal at renewed intensity after having been attenuated in the act of traversing a length of the optical fiber. One typical repeater station employs a photodetector to convert the received optical signal into an electrical signal, an electrical amplification circuit to amplify the converted signal, and a modulated semiconductor diode laser to reradiate the amplified signal as an optical output into another optical fiber waveguide segment.

N. A. Olsson et al., in a paper entitled "Polarization-Independent Optical Amplifier with Buried Facets" in *Electronics Letters.*, vol. 25, no. 16, pp. 1048-1049 (Aug. 3, 1989), describe a GaInAsP/InP laser amplifier structure grown in 500 μm long, terminated v-grooves etched in an through a semi-insulating InP layer on top of an InP substrate. The active layer of the amplifier structure is made thick, so that the confinement factors and single-pass gains for the TE- and TM-polarized input waves are equal to within 1 dB at all drive currents and wavelengths. The amplifiers are cleaved from the wafer between the etched and filled, terminated v-grooves, leaving 15-30 μm passive sections at each external facet. The interfaces between the passive sections and the active amplifier structure grown in the v-grooves form buried facets with reduced overall reflectivity and substantially eliminated polarization dependence. The buried facets are at a non-normal angle to the amplifier waveguide to direct any interface scattering out of the waveguide. Light is coupled into and out of the amplifier through the antireflection coated external end facets.

Such an optical amplifier could be useful in lightwave communications to replace the conventional optical repeaters in the optical fiber waveguide network. However, further improvement in reducing coupling losses due to misalignment with a fiber and in suppressing feedback into the gain region of the amplifier is sought. Further, it is desired that an amplifier structure for optical communications have the ability to switch light from one input port to any one of several output ports.

Accordingly, it is an object of the present invention to provide an optical amplifier structure that achieves the aforementioned improvements.

It is also an object of the invention to provide an amplifier array that provides the desired switching ability.

DISCLOSURE OF THE INVENTION

The above objects have been met with an amplifier which includes at least one highly reflective facet at an end of the amplifier waveguide and oriented at a nonperpendicular angle to the waveguide to couple light vertically with a top or bottom surface of the amplifier. Because the vertically directed light is unguided, any reflection at the input or output coupling surface or at a layer interface is poorly coupled back into the waveguide, thereby substantially eliminating feedback that could cause self-oscillation. Angled facets could be at just one end of the waveguide, the other end being end coupled, or could be at both ends of the waveguide for surface coupling at each end. If the pair of facets are approximately parallel, input and output surface coupling will be through opposite surfaces of the semiconductor amplifier body, while if the pair of facets are approximately perpendicular, surface coupling for both input and output will be on the same side of the amplifier. Preferably, the facets will be totally internally reflecting.

Multiple amplifiers can be formed end-to-end in tandem on a common substrate with v-grooves in the amplifier heterostructure interrupting the amplifier waveguides into multiple waveguide segments and creating angled facets between each pair of segments for adjacent amplifiers. Multiple waveguides can be laterally spaced apart between angled facets. Either construction will provide an amplifier linear array, while employing both multiple waveguides and multiple end-to-end amplifiers will provide a two-dimensional amplifier array or matrix.

In an optical repeater station, each end of a waveguide is optically coupled to an optical fiber waveguide. One waveguide couples light into the waveguide, while another receives the amplified light output from that waveguide. Optical fibers may be butted to the amplifier, lens-coupled to the amplifier, terminate in a curved lens surface, or simply be spaced apart from the amplifier in optical coupling relation. To minimize feedback into the waveguide from reflections off of the optical fiber end, the waveguide can be tilted slightly or have an end face that is slanted at an angle. The amplifier reflective facets could also be oriented at other than 45° with respect to the amplifier waveguide to couple light through the surface at a nonperpendicular angle to that surface.

BEST MODE FOR CARRYING OUT THE INVENTION

Figure 1:
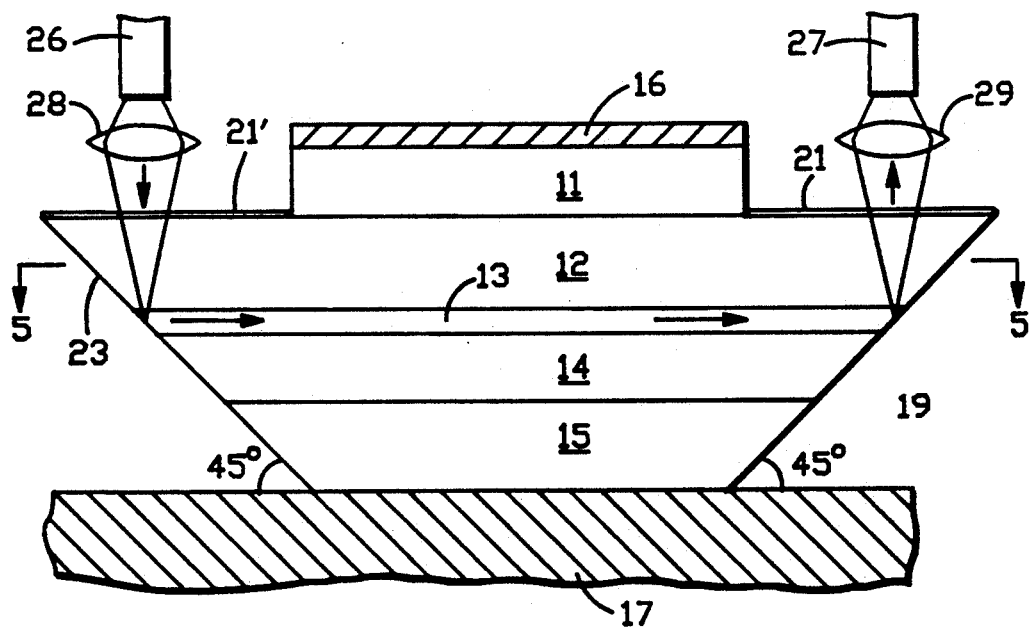
FIGS. 1-3 are side plan views of semiconductor optical amplifier repeater stations of the present invention.
Figure 2:
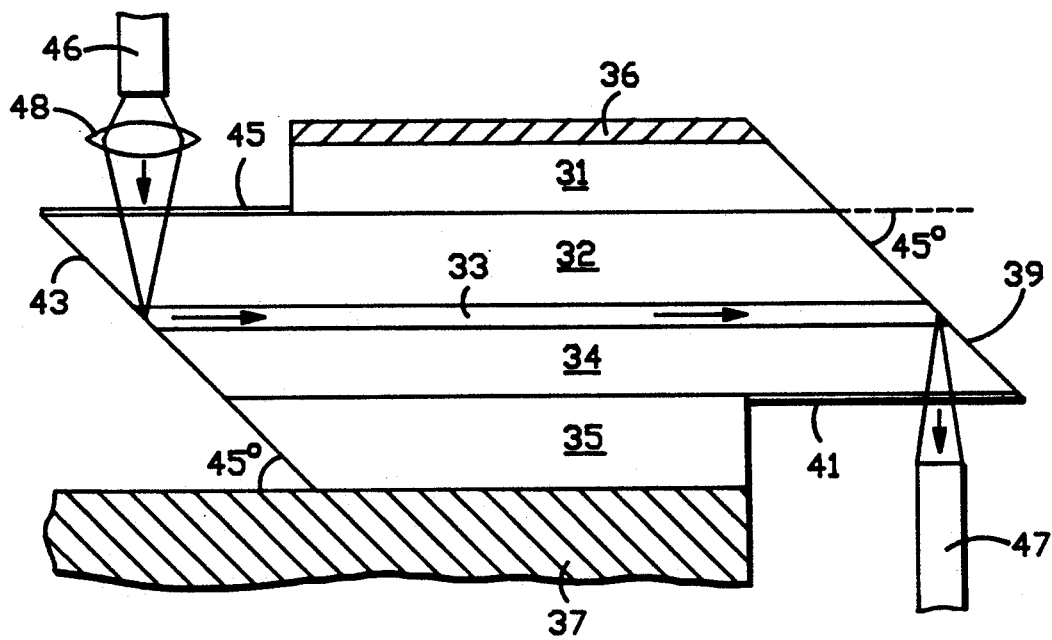
Figure 3:
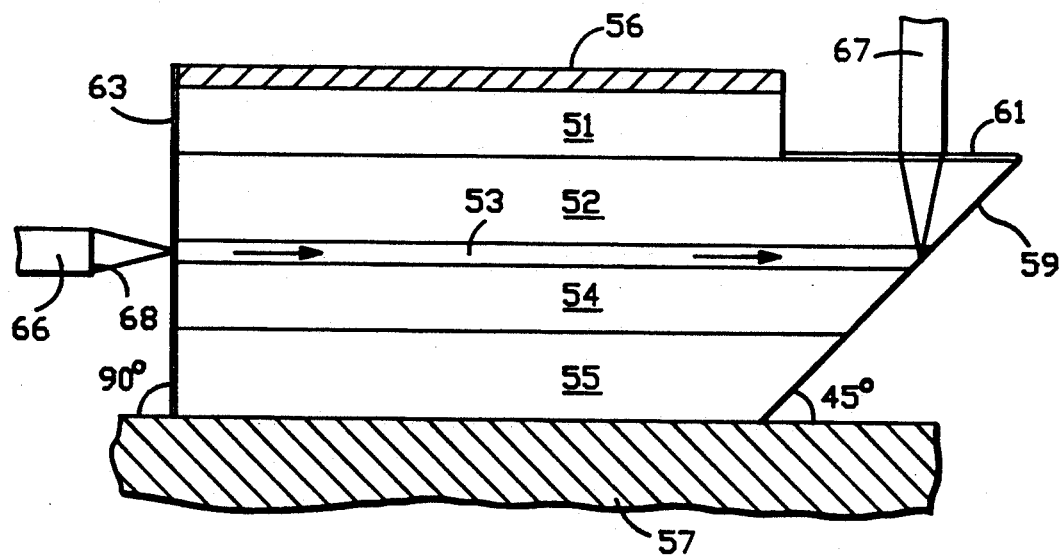
Figure 5:
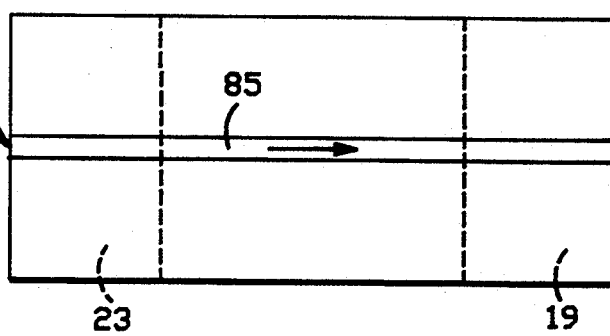
FIGS. 5-8 are top sectional views taken along the lines 5—5 in FIG. 1 of waveguide configurations for the amplifiers depicted in the repeater stations of FIGS. 1-4.

With reference to FIGS. 1-3, semiconductor optical amplifiers of the present invention have a semiconductor body formed from a substrate 11, 31 or 51 and a plurality of semiconductor layers 12-15, 32-35 or 52-55 disposed on the substrate 11, 31 or 51, respectively. The semiconductor body includes an active gain region 13, 33 or 53 formed from one or more of the semiconductor layers proximate to a semiconductor pn junction of the body for amplification of lightwaves received by the structure. Conductive contacts 16 and 17, 36 and 37 or 56 and 57 are disposed on the substrate 11, 31 or 51 and top cap layer 15, 35 or 55 of the semiconductor body for applying an electrical forward bias to the body across the pn junction, injecting current through the active gain region 13, 33 or 53 to cause the light amplification. If the semiconductor body is unbiased, or reverse biased, the optical amplifier device can act as a surface-coupled light detector to generate an electrical signal output from the optical signal input. In FIGS. 1-3, the contact 17, 37 or 57 doubles as a heat sink to which the cap layer 15, 35 or 55 is securely mounted.

The active gain region 13, 33 of 53 together with semiconductor layers 12 and 14, 32 and 34 or 52 and 54 adjacent to the active gain region 13, 33 or 53 form a waveguide for guiding the propagation of the lightwaves in the waveguide from one end of the active gain region 13, 33 of 53 to the other. Typically, the semiconductor body is a heterostruoture of GaAs/AlGaAs or some other combination of group III-V semiconductor compounds. But, other light emitting semiconductor materials and structures found in semiconductor diode lasers could also be used, without the feedback mechanisms for creating the resonant cavities of such lasers. Preferably, lateral waveguiding structures, such as gain guides, real refractive index guides or both, are provided in addition to the transverse guiding of the semiconductor layers 12-14, 32-34 or 52-54, especially in those optical amplifiers intended to be coupled to tiber waveguides as part of an optical communications system. FIGS. 5-8 show various possible waveguide configurations. The waveguides may be single mode waveguides, i.e. be capable of supporting only a single spatial mode of lightwave propagation. They could also be multimode waveguides capable of supporting several spatial modes of lightwave propagation.

The optical amplifiers of the present invention have at least one reflective facet 19, 39 or 59 oriented at an angle other than perpendicular to the waveguide 12-14, 32-34 or 52-54. This facet 19, 39 or 59 is positioned at an end of the waveguide so as to deflect light which is incident upon it from inside the waveguide transversely out of the waveguide toward a top or bottom surface 21, 41 or 61 of the semiconductor body. Likewise, vertically directed light which is incident through the surface 21, 41 or 61 of the semiconductor body and focused onto the angled reflector 19, 39 or 59 is deflected into the waveguide. Thus, the reflectors 19, 39 or 59 couple light between the waveguide 12-14, 32-34 or 52-54 and a top or bottom surface 21, 41 or 61 of the semiconductor body. The reflective facet 21, 41 or 61 is highly reflective, preferably totally internally reflecting, to reduce optical losses from the amplifier. A 45° angle between the direction of light propagation in the waveguide and the normal to the facet plane is typical, producing total internal reflection at a right angle. However, other facet orientations are possible, as seen for example in FIG. 15.

The embodiments in FIGS. 1 and 2 have a second reflecting facet 23 or 43 at the opposite end of the waveguide 12-14 or 32-34 from the first reflecting facet 19 or 39. The second reflecting facet 23 or 43 is also oriented at a nonperpendicular angle with respect to the waveguide 12-14 or 32-34 to deflect light transversely from the waveguide to a top or bottom surface 21' or 45 of the semiconductor body or vice versa, i.e. from the surface 21' or 45 into the waveguide 12-14 or 32-34. There are two possibilities. When the two reflecting facets 19 and 23 are approximately perpendicular to one another, as in FIG. 1, the surfaces 21 and 21' to which the light is coupled are on the same side of the semiconductor body for both input and output. When the two reflecting facets 39 and 43 are approximately parallel to one another, as in FIG. 2, the surfaces 41 and 45 to which the light is coupled are on opposite sides of the semiconductor body. The second reflective facet 23 or 43 is also highly reflective, preferably totally internally reflecting, to minimize loss of optical power from the amplifier. An angle of 45° with respect to the propagation direction in the waveguide is typical, providing right angle deflection of the light.

In FIG. 3, the opposite end of the waveguide 52-54 from the angled facet 59 has a low reflectivity facet 67 normal to the direction of light propagation in the waveguide. At this end of the waveguide 52-54, light is coupled through the end facet 67, rather than through a top or bottom surface of the semiconductor body. Preferably, the end facet 67 is antireflection coated to substantially eliminate feedback into the waveguide 52-54.

Figure 17:
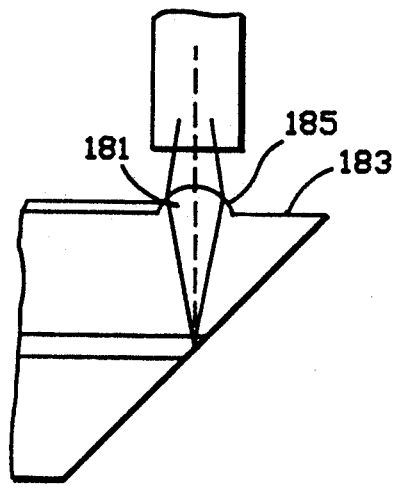

In a fiberoptic communications network, an optical repeater or relay system includes a semiconductor amplifier of the present invention, such as those seen in FIGS. 1-3, optically coupled to ends of a pair of optical fiber waveguides 26 and 27, 46 and 47 or 66 and 67. In FIG. 1, fiber waveguide 26 emits light which is focused by a lens 28 through the surface 21' onto the angled facet 23. The facet 23 reflects the incident light into the waveguide 12-14, where it propagates toward the angled facet 19 at the opposite end of the waveguide 12-14, being amplified along the way. At the facet 19, the amplifier light is deflected out of the waveguide 12-14 through surface 21 and lens 29 into optical fiber 27. Operation of the fiber coupled amplifier repeater system in FIG. 2 is similar, except that the fibers 46 and 47 are on opposite sides of the semiconductor body proximate to the corresponding surfaces 45 and 41. Further, while the light input from fiber 46 is focused by a lens 48, the amplified light output need not be focused into the fiber waveguide 47 by a lens if the fiber waveguide has a suitable numerical aperture for accepting the light. Operation of the fiber coupled amplifier repeater system in FIG. 3, is likewise similar except that light from fiber 66 is coupled into the amplifier's waveguide 52-54 through the low reflectivity end facet 63. FIG. 3 also illustrates that the focusing lens could be a curved surface 68 on the end of the fiber waveguide 66. FIG. 17 shows that the focusing lens could be formed directly on the amplifier surface. Further, fibers 67 could also be butted against and bonded to the coupling surface 61. While the embodiments in FIGS. 1-3 all depict light propagation proceeding from left to right, light could also propagate in the opposite direction. For example, in FIG. 3, light could be coupled from fiber 67 into the waveguide via angled facet 59, propagate leftward from the right end of active region 53 toward perpendicular low reflectivity facet 63 and be coupled into fiber 66. The light propagates in one direction through the waveguides 12-14, 32-34 or 52-54, due to the absence of optical feedback, preventing self-oscillation. However, the amplifiers are reversible, and the light signal can propagate in either direction, depending on which end receives the light input and which end emits the light output.

By diffracting the light output vertically through the top or bottom surface 21, 21', 41, 45 or 61, without waveguiding in the vertically directed portion of the light path, the coupling back into the waveguide 12-14, 32-34 or 52-54 is substantially reduced, even when the surfaces 21, 21', 41, 45 or 61 are not completely nonreflective. Preferably, the coupling surfaces 21, 21', 41, 45 and 61 are antireflection coated to further reduce feedback. Any heterostructure layer interfaces in the light path can be formed with graded composition to reduce reflective feedback at those interfaces. The grading can be continuous, being formed by the diffusion of zinc or silicon through the semiconductor heterostructure, or by some other known process. The grading could also be stepped in one-quarter wavelength intervals, being formed by the growth of thin one-quarter wavelength thick layers of changing composition. To prevent substantial attenuation of the amplified light as it passes vertically through the semiconductor layers to the coupling surface, the substrate 11, 31 or 51 can be partially removed, such as by etching, in the vertical light path areas leading to surfaces 21, 21', 45 and 61. Alternatively, the substrate material can have a higher bandgap than the active gain region so as to be transparent to the lightwaves. For example, the substrate 11, 31 or 51 could be GaAs and the active gain region could be InGaAs.

Figure 4:
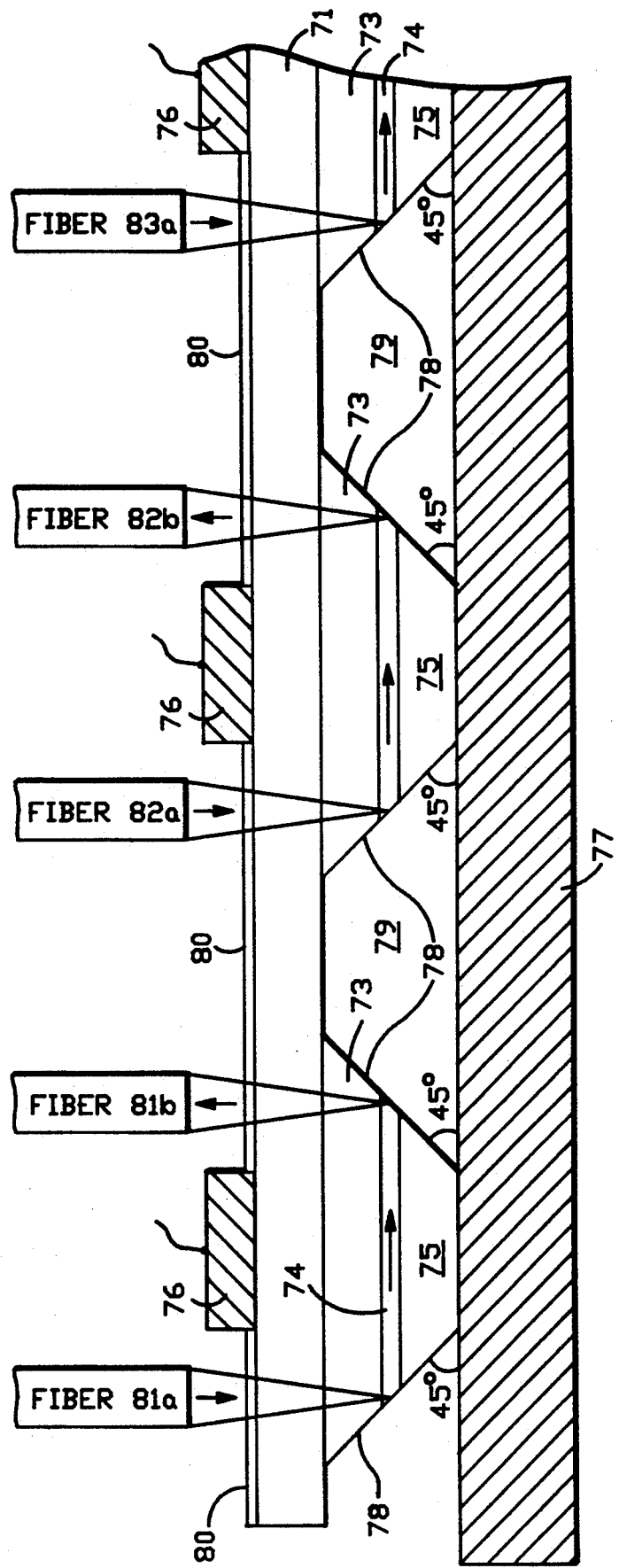
FIG. 4 is a side plan view of a semiconductor optical amplifier array repeater station of the present invention.

With reference to FIG. 4, more than one amplifier may be provided on the same substrate 71, forming an amplifier array. A plurality of semiconductor layers 73-75 are disposed on the substrate 71. Together they form a semiconductor body including an active gain region 74 and cladding layers 73 and 75 adjacent to the active gain region, together forming a waveguide 73-75 for propagation of lightwaves therein. The active gain region 74 and waveguide 73-75 are broken at intervals by terminated v-grooves 79 etched into the semiconductor body. The terminated v-grooves form angled facets 78 for totally internally reflecting lightwaves into or out of the waveguide 73-75. Each waveguide segment and the pair of angled facets on each end from v-grooves 79 bounding that waveguide segment forms an amplifier like that in FIG. 1. Thus, a line of amplifiers are formed by the successive waveguide segments with v-grooves in between.

The monolithic amplifier array is mounted top-side down on a thermally and electrically conductive heat sink and contact 77. The substrate 71 is thinned to reduce attenuation of light that must pass through it as part of the folded light path. The substrate 71 could also be made transparent to the lightwaves, for example, by choosing a substrate material with larger bandgap relative to the active gain region 74. Areas of the substrate surface 80 which are opposite the terminated v-grooves 79 and angled reflective facets 78 are preferably antireflection coated, and form the coupling surface to respective optical fibers 81a, 81b, 82a, 82b, 83a, etc. Areas of the substrate surface opposite the waveguide segments 73-75 have an electrically conductive contact 76 for forward biasing the semiconductor body and injecting current through the active gain region 74.

In operation, light from optical fiber 81a is coupled through the substrate surface 80 into a segment of waveguide 73-75, where it is amplified then coupled out through the substrate surface 80 into optical fiber 81b. Similarly, light from optical fiber 82a is amplified by another segment of waveguide 73-75 and coupled into optical fiber 82b, etc. All of the fibers are on the same side of the amplifier array, since the v-grooves form facets 78 which are approximately perpendicular to one another and thus couple light to and from the same side of the amplifier. Directional ion beam etching could be used to form tilted slots with sloped facets which are all approximately parallel to one another, as in FIG. 2. In this case, input fibers 81a, 82a, 83a, etc. would be on one side of the amplifier array and output fibers 81b, 82b, etc. would be on the opposite side of the amplifier array, with suitable modifications to the heat sink 77 to avoid obstruction of the light.

Figure 6:
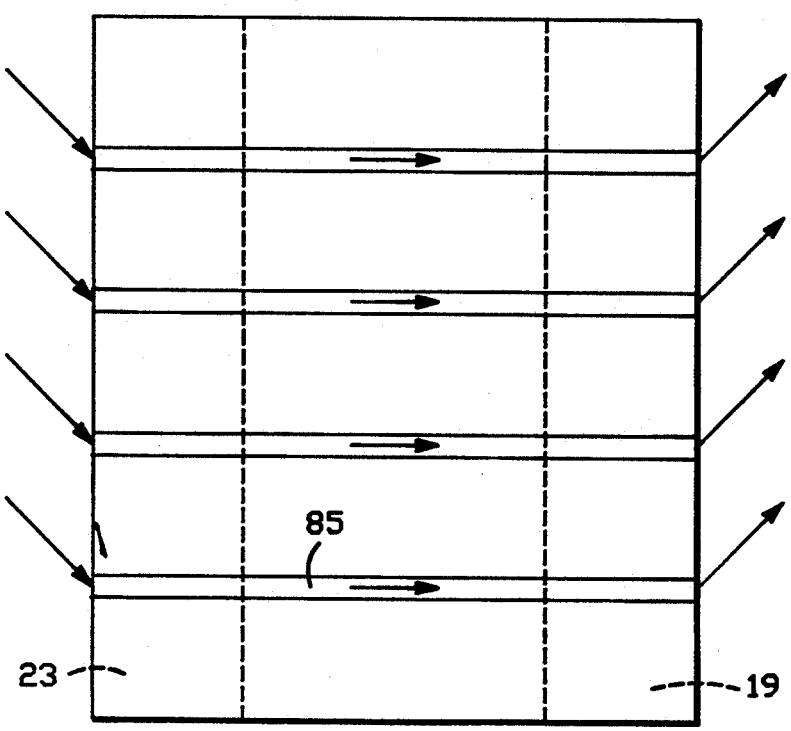

With reference to FIGS. 5-8, as previously mentioned the lightwaves which are coupled into the semiconductor body may not only be guided in the transverse dimension, but also laterally, either by gain guiding, real refractive index guiding or both. A top view of the waveguide layers 12-14 of FIG. 1 is seen with one possible waveguide configuration in FIG. 5. Here a single waveguide 85 confines the light laterally along a single optical path from its reflection into the waveguide 85 by angled facet 23 to its reflection out of the waveguide 85 at angled facet 19. The waveguide 85 may be either a single mode or multimode waveguide. In combination with FIG. 4, this configuration could be repeated for each amplifier in the monolithic structure, thereby resulting in a linear amplifier array. The configuration in FIG. 6 shows multiple waveguides 86-89 may be placed side-by-side in the same semiconductor body to form a linear amplifier array. Each of the waveguides 86-89 couples to its own pair of optical fibers at the amplifier's top or bottom surface to receive light via angled facet 23 and transmit amplified light via angled facet 19. In combination with the embodiment in FIG. 4, the configuration in FIG. 6 will provide a two-dimensional amplifier array or matrix. The amplifier arrays, either linear or two-dimensional, are useful as a repeater station for a bun-dle of optical fibers.

Figure 7:
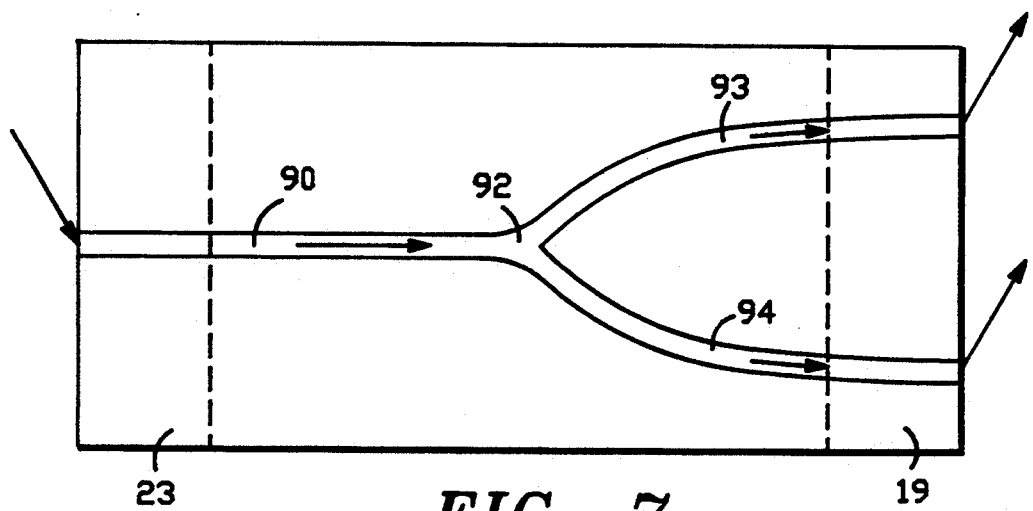
Figure 8:
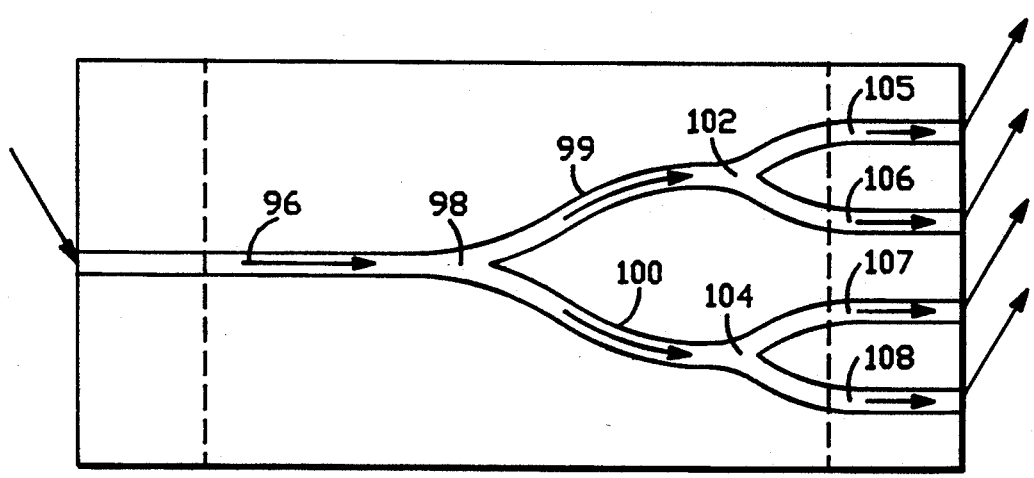

In FIGS. 7 and 8, waveguide configurations in which lateral waveguide branching occurs are seen. In FIG. 7, waveguide 90 branches at a y-junction 92 into two separate spaced apart waveguides 93 and 94. The lightwaves from an optical fiber are surface coupled into waveguide 90 via an angled facet 23. The lightwaves propagate along waveguide 90, being amplified along the way. The light path splits at y-junction 92 so that the light is coupled into both waveguides 93 and 94. Preferably, the y-junction has bilateral symmetry so that coupling is equal for each waveguide 93 and 94. Lighwaves propagating in waveguides 93 and 94 are amplified by at least one of them, and are then surface coupled out of their respective waveguides via angled mirror 19. If both waveguide sections 93 and 94 provide amplification, then the optical signal from one optical fiber can be coupled into two optical fibers. If one selected amplifier section 93 or 94 provides amplification while the other is selectively left unpumped and thereby provides optical attenuation via absorption, then configuration can be used to selectively switch the optical output from one fiber into a selected one of two optical fiber inputs. FIG. 8 extends the branching to an additional level with a first y-junction 98 connecting a single waveguide 96 to two lateral spaced apart waveguides 99 and 100, and with second and third y-junctions 102 and 104 connecting respective waveguides 99 and 100 to waveguides 105-108. This can be used to provide a one-to-four multiplication of the optical path, or switching between one of four optical fibers.

Figure 9:
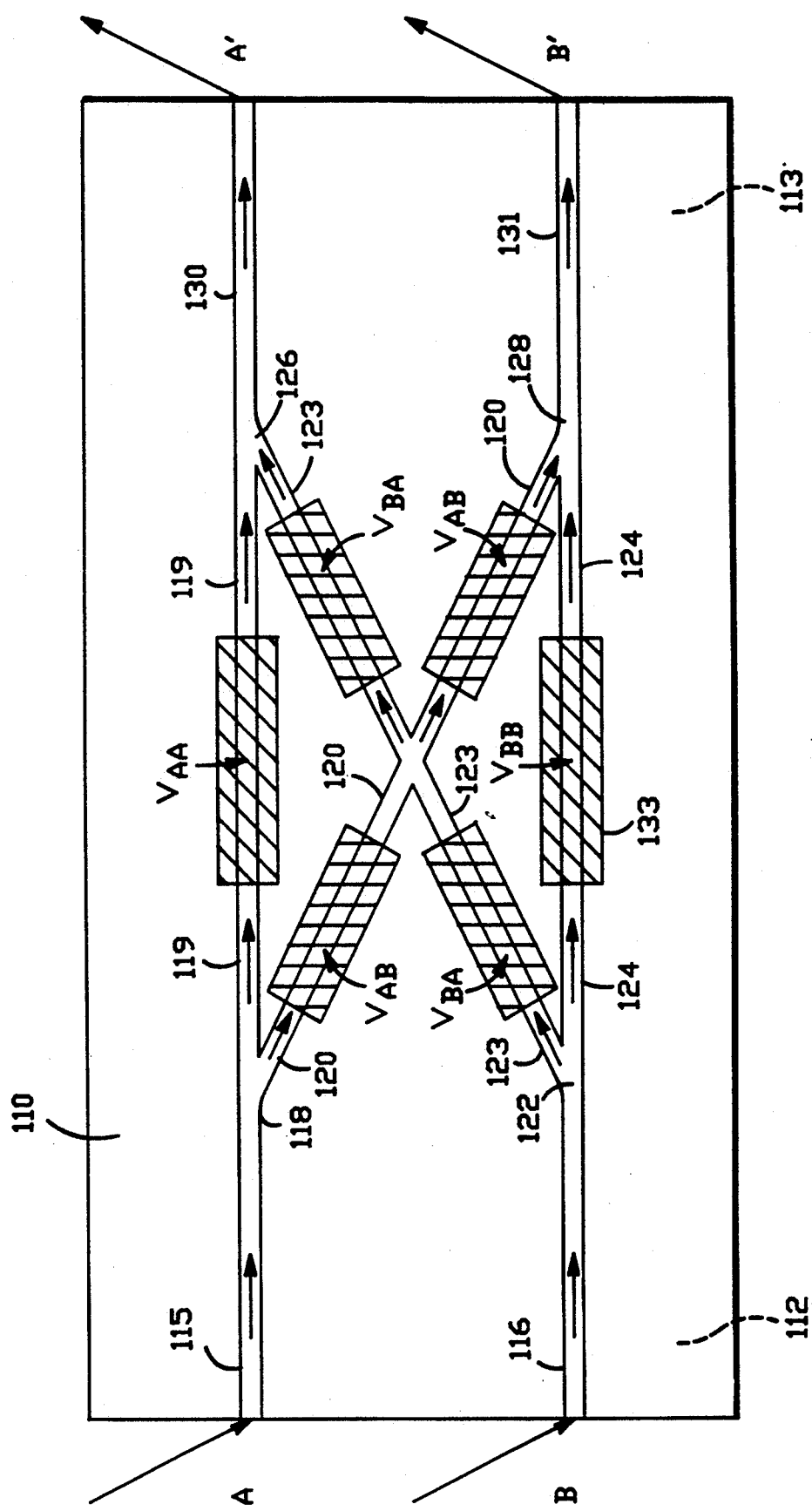
FIG. 9 is a top plan view of a crossbar switch waveguide configuration for use in the amplifiers shown in FIGS. 1-4.

With reference to FIG. 9, a semiconductor optical amplifier 110 of the present invention with angled reflective facets 112 and 113 is configured with waveguides 115, 116, 119, 120, 123, 124, 130 and 131 into a two input by two output crossbar switch. Waveguide 115 branches at a first y-junction 118 into two waveguides 119 and 120. Waveguide 116 branches at a second Y-junction 122 into two waveguides 123 and 124. Waveguide branches 119 and 123 converge at a third y-junction 126 into a single waveguide 130. Waveguide branches 120 and 124 converge at a fourth y-junction 128 into a single waveguide 131.

Separately addressed electrodes 133 on a top or bottom surface of the amplifier 110 apply selected bias voltages $V_{AA}$, $V_{AB}$, $V_{BA}$ and $V_{BB}$ to the branch waveguides 119, 120, 123 and 124 to selectively amplify or cause attenuation of the optical signal on each branch waveguide. When a forward bias voltage $V_{AA}$ is applied to the active gain region in branch waveguide 119, light passing from wavequide 115 to wavequide 130 is amplified. When a forward bias voltage $V_{AB}$ is applied to the active gain region in branch waveguide 120, light passing from waveguide 115 to waveguide 131 is amplified. When a forward bias $V_{BA}$ is applied to the active gain region in branch waveguide 123, light passing from waveguide 116 to waveguide 130 is amplified. When a forward bias voltage $V_{BB}$ is applied to the active gain region in branch waveguide 124, light passing from waveguide 116 to waveguide 131 is amplified. When no bias or a reverse bias voltage is applied to any one of the waveguides, then light attempting to pass along that unpumped waveguide is substantially attenuated. Through the use of the separately addressed electrodes 133, optical signals A and B surface coupled into respective waveguides 115 and 116 via angled facet 112 are effectively routed to the selected waveguides 130 and 131, where the now amplified signals A' and B' are surface coupled via angled facet 113.

Figure 16:
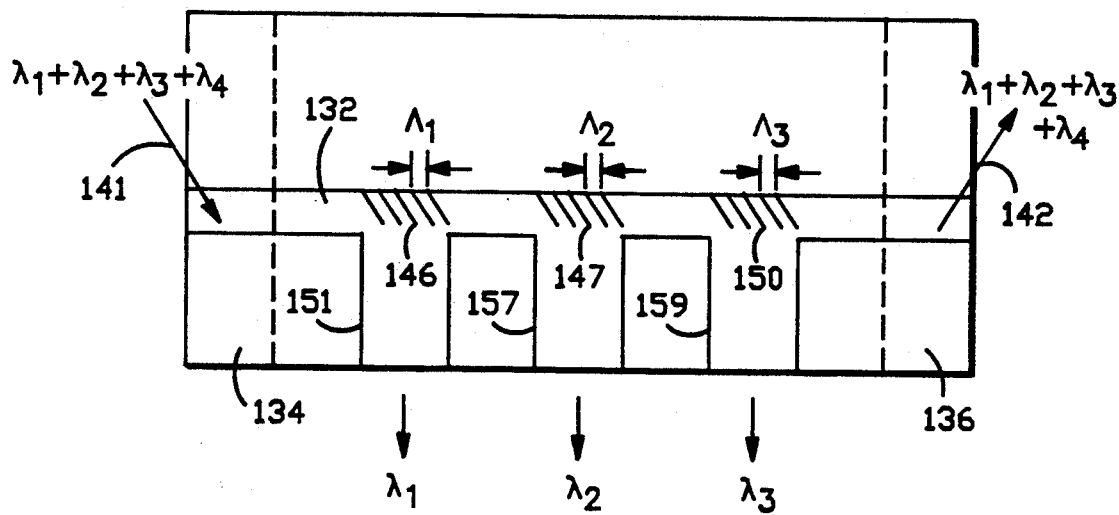
FIG. 16 is a top plan view of waveguide configuration for the amplifiers depicted in the repeater stations of FIGS. 1-4 for use as a wavelength demultiplexer.

There are other mechanisms available for splitting the surface-coupled light beam in the amplifier waveguide into multiple output beams. For example, in FIG. 16, a surface-coupled amplifier includes a waveguide 132 extending from a first angled facet 134 to a second angled facet 136 so that light 141 input through a top or bottom surface of the amplifier is reflected by facet 134 into waveguide 132, propagates along waveguide 132 and is reflected vertically out through a surface of the amplifier by the angled facet 136 to form an amplified light output 142. Along the waveguide 132 there are a number of grating segments 146, 147 and 150, each with a different grating period $A_1$, $A_2$ and $A_3$, respectively, and each oriented in the waveguide 132 at an angle to the length of waveguide 132. Each grating segment 146, 147 and 150 therefore reflects a different wavelength component $\lambda_1$, $\lambda_2$ and $\lambda_3$ of the light 141 admitted into waveguide 132 into amplifier waveguide branches 151, 157 and 159. The amplifier thus can function as an optical signal demultiplexer, where the optical fiber waveguides that deliver light 141 to the amplifier carry distinct messages at different wavelengths. Any wavelengths $\lambda_4$ not reflected by the grating segments 146, 147 and 150 of a particular amplifier station are carried on the output beam 142 through a connecting fiber waveguide to the next station.

Figure 10:
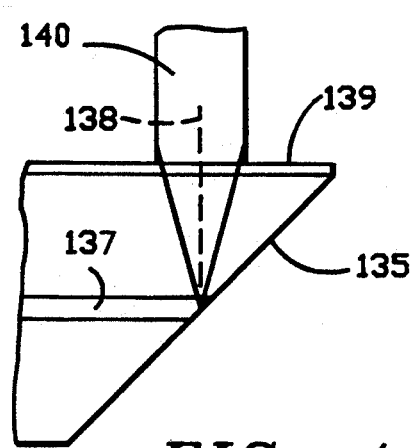
FIGS. 10-15 and 17 are partial side plan views of amplifier-optical fiber coupling arrangements for the repeater stations of FIGS. 1-4.
Figure 11:
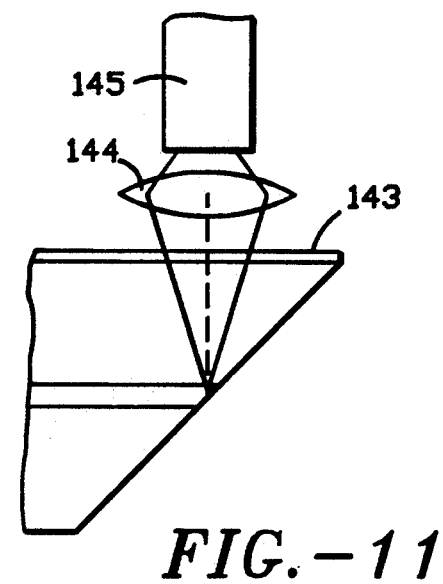
Figure 12:
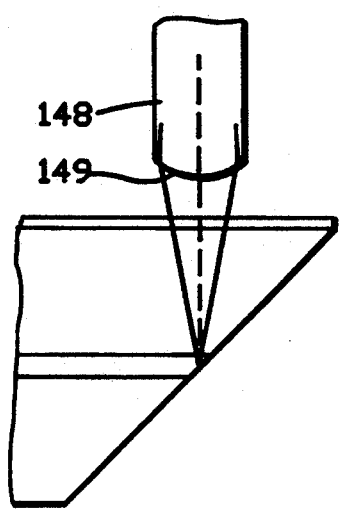

With reference to FIGS. 10-15, there are different ways to couple light from an optical fiber through a surface of the amplifiers of the present invention. In FIG. 10, a 45° angled facet 135 reflects light from waveguide 137 along an axis 138 at right angles to the waveguide 137 into a fiber 140 that is butted against a surface 139 of the amplifier. The fiber 140 can be securely bonded in place by this method, providing stable light coupling to the fiber 140. In FIG. 11, the fiber 145 can be spaced away from the amplifier surface 143. A lens 144 causes the diverging light from the surface 143 to reconverge into the end of the fiber 145. In FIG. 12, the fiber 145 and lens 144 are replaced by a fiber 148 with a curved end surface 149. Such fibers tend to have a larger numerical aperture compared to straight end fibers with the same core and cladding characteristics.

A lens 181 could also be formed directly on the amplifier surface 183, as seen in FIG. 17. This lens could be a curved portion extending above the otherwise planar surface 183 to form a spherical refracting surface 185, or can be a diffraction lens. The lens can be formed on the amplifier surface by photolithography followed by etching or mass transport of the substrate material.

Figure 13:
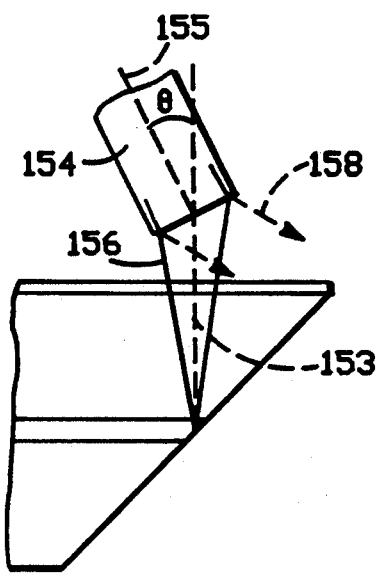
Figure 14:
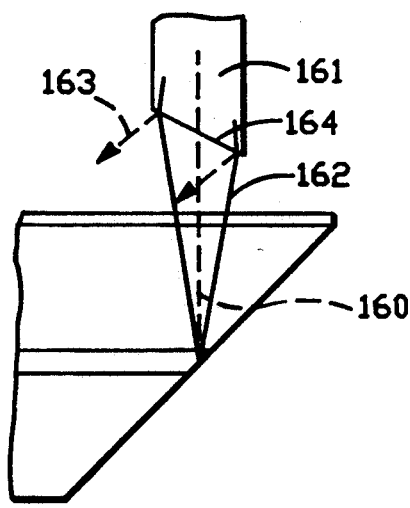
Figure 15:
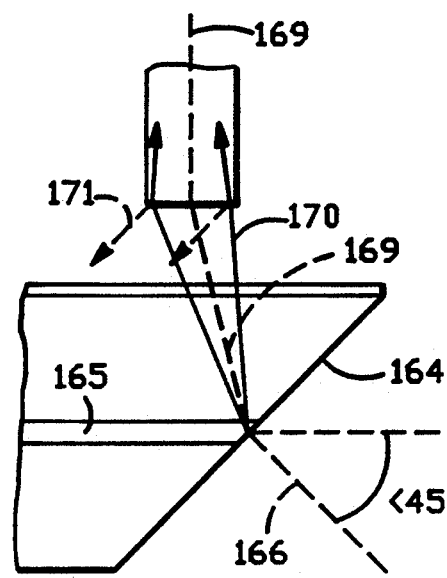

In order to reduce the possibility that light reflected off of the fiber ends will be coupled back through the amplifier surface into the waveguide 152, the fiber 154 may be tilted slightly as shown in FIG. 13. Light 156 that is generally emitted along central axis 153 perpendicular to the amplifier surface is coupled into a fiber 154 generally oriented along an axis 155 which is at a small angle $\theta \neq 0$ relative to the axis 153. Accordingly, any light 158 reflected at the end of fiber is directed in a direction that is not along axis 153 and consequently does not couple back into the amplifier's waveguide 152. In FIG. 14, the length of the fiber 161 is aligned with the central axis 160 of light 162 emitted by the amplifier, but the fiber end 164 is sliced or etched so that it is not perpendicular to the axis 160. Accordingly, reflected light 163 from the fiber end 164 is directed away from the axis 160. In FIG. 15, the fiber 168 is oriented with its axis 169 perpendicular to the amplifier's surface and with the fiber end parallel to that surface, but the amplifier's angled facet 164 is oriented at an angle of other than 45° to the waveguide 165. Consequently, lightwaves in waveguide 165 are reflected by facet 164 in a direction 167 that is not exactly 90° with amplifier waveguide 165. Light 170 is incident upon the end of fiber 168 at other than a right angle so any reflected light 171 is directed away from the return axis 167 leading to the waveguide 165. Other configurations are also possible.

We claim:

1. A semiconductor optical amplifier comprising
a plurality of semiconductor layers disposed on a substrate, the plurality of layers and substrate together forming a semiconductor body, said semiconductor body of semiconductor layers and substrate being a group III-V compound semiconductor heterostructure, said semiconductor body including at least one active gain region therein for amplification of lightwaves received by said semiconductor body, said active gain region and semiconductor layers adjacent to said active gain region forming at least one waveguide for guiding propagation of said lightwaves therein,
said semiconductor body having at least one reflective end facet oriented at an angle other than perpendicular to said waveguide and positioned so as to reflect light vertically out of said waveguide and couple said reflected light between said waveguide and a substantially nonreflective top or bottom surface of said semiconductor body, wherein interfaces between said semiconductor layers in a path of lightwaves between said waveguide and said surface are of graded composition, said vertically reflected light being unguided within said semiconductor body, any light reflected by said substantially nonreflective top or bottom surface or by any intervening layer interface of said semiconductor body having a very low probability of being recoupled back into said waveguide, thereby suppressing self-oscillation, and bias means for applying an electrical forward bias to said semiconductor body and injecting current through said active gain region to cause said lightwave amplification.

2. The amplifier of claim 1 wherein said at least one reflective facet is oriented at a 45° angle to the waveguide, whereby lightwaves coupled by said reflective facet between said waveguide and said surface of said semiconductor body are incident on said surface perpendicular thereto.

3. The amplifier of claim 1 wherein said graded composition is a continuous grading.

4. The amplifier of claim 1 wherein said graded composition is a stepped grading at one-quarter wavelength intervals.

5. The amplifier of claim 1 wherein a transparent window region is disposed in said semiconductor body in a path of lightwaves deflected by said reflective facet between said waveguide and said surface.

6. A semiconductor optical amplifier comprising a plurality of semiconductor layers disposed on a substrate, the plurality of layers and substrate together forming a semiconductor body, said semiconductor body including at least one active gain region therein for amplification of lightwaves received by said semiconductor body, said active gain region and semiconductor layers adjacent to said active gain region forming a plurality of laterally spaced apart waveguides for guiding propagation of said lightwaves therein, said semiconductor body having angled facets formed through said plurality of semiconductor layers, each waveguide interrupted by said angled facets to form a matrix of laterally spaced part waveguide segments disposed end-to-end in tandem with said angled facets therebetween, said waveguide segments being optically isolated from one another, and also at least one reflective end facet oriented at an angle other than perpendicular to said waveguide, each facet positioned so as to reflect light vertically out of said waveguide segments and couple said reflected light between said waveguide segments and a substantially nonreflective top or bottom surface of said semiconductor body, said vertically reflected light being unguided within said semiconductor body, any light reflected by said substantially nonreflective top or bottom surface or by any intervening layer interface of said semiconductor body having a very low probability of being recoupled back into said waveguide segments thereby suppressing self-oscillation, and bias means for applying an electrical forward bias to said semiconductor body and injecting current through said active gain region to cause said lightwave amplification.

7. The amplifier of claim 6 wherein each said waveguide segment supports only a single spatial mode of lightwave propagation.

8. The amplifier of claim 6 wherein each said waveguide segment supports multiple spatial modes of lightwave propagation.

9. The amplifier of claim 6 wherein angled facets at opposite ends of the same waveguide segments are approximately perpendicular to one another, whereby coupling of all received and emitted lightwaves is through the same surface of said semiconductor body.

10. A semiconductor optical amplifier comprising a plurality of semiconductor layers disposed on a substrate, the plurality of layers and substrate together forming a semiconductor body, said semiconductor body including at least one active gain region therein for amplification of lightwaves received by said semiconductor body, said active gain region and semiconductor layers adjacent to said active gain region forming a pair of waveguides for guiding propagation of said lightwaves therein, each of said pair of waveguides having a y-shaped splitting junction and a y-shaped combining junction associated therewith, each of said y-shaped splitting junctions receiving a single first waveguide portion of one of said pair of waveguides and splitting said first waveguide portion into two spaced apart waveguide branches, each of said y-shaped combining junctions receiving one waveguide branch from each of said y-shaped splitting junctions and combining the waveguide branches into a single second waveguide portion of one of said pair of waveguides, whereby each of said second waveguide portions is coupled via said waveguide branches to both of said first waveguide portions, said semiconductor body having at least one reflective end facet oriented at an angle other than perpendicular to said waveguide and positioned so as to reflect light vertically out of said waveguide and couple said reflected light between said waveguide and a substantially nonreflective top or bottom surface of said semiconductor body, said vertically reflected light being unguided within said semiconductor body, any light reflected by said substantially nonreflective top or bottom surface or by any intervening layer interface of said semiconductor body having a very low probability of being recoupled back into said waveguide, thereby suppressing self-oscillation, and bias means for applying an electrical forward bias to said semiconductor body and injecting current through said active gain region to cause said lightwave amplification, wherein said first and second waveguide portions and only a selectable pair of said waveguide branches are electrically pumped by said bias means.

11. The amplifier of claim 10 wherein each waveguide terminates at said at least one reflective facet.

12. The amplifier of claim 10 wherein an input end and an output end of each of said pair of waveguides are selectably interchangeable, whereby lightwaves propagate unidirectionally in each said waveguide from said selected input end to said selected output end.

13. A semiconductor optical amplifier comprising a plurality of semiconductor layers disposed on a substrate, the plurality of layers and substrate together forming a semiconductor body, said semiconductor body including at least one active gain region therein for amplification of lightwaves received by said semiconductor body, said active gain region and semiconductor layers adjacent to said active gain region forming a waveguide for guiding propagation of said lightwaves therein, said semiconductor body further including means for splitting said waveguide into multiple waveguide branches and for coupling lightwaves propagating in said waveguide into said waveguide branches, whereby said semiconductor body accepts a single light input and provides multiple light outputs, said splitting means including at least one grating segment disposed along said waveguide, each grating segment having a grating period and oriented at an angle to the direction of lightwave propagation in said waveguide to reflect lightwaves of a particular wavelength into a waveguide branch, said semiconductor body also having at least one reflective end facet oriented at an angle other than perpendicular to said waveguide and positioned so as to reflect light vertically out of at least one of said waveguide and said waveguide branches and couple said reflected light to a substantially nonreflective, top or bottom surface of said semiconductor body, said vertically reflected light being unguided within said semiconductor body, any light reflected by said substantially nonreflective top or bottom surface or by any intervening layer interface of said semiconductor body having a very low probability of being recoupled back into said waveguide, thereby suppressing self-oscillation, and bias means for applying an electrical forward bias to said semiconductor body and injecting current through said active gain region to cause said lightwave amplification.

14. The amplifier of claim 13 wherein said semiconductor body has a first reflective facet oriented at an angle other than perpendicular to said waveguide for coupling lightwaves to said waveguide through a surface of said semiconductor body and a second nonreflective facet oriented perpendicular to said waveguide branches for coupling lightwaves from said waveguide branches through a side of said semiconductor body.

15. A semiconductor optical amplifier comprising
a plurality of semiconductor layers disposed on a substrate, the plurality of layers and substrate together forming a semiconductor body, said semiconductor body including at least one active gain region therein for amplification of lightwaves received by said semiconductor body, said active gain region and semiconductor layers adjacent to said active gain region forming at least one waveguide for guiding propagation of said lightwaves therein, said semiconductor body having two reflective facets oriented at an angle other than perpendicular to said at least one waveguide, a first reflective facet being positioned at one end of said at least one waveguide, a second reflective facet being positioned at an opposite end of said at least one waveguide, both vertically directed and focussed lightwaves received by said semiconductor body and amplified lightwaves emitted vertically from said semiconductor body being coupled by said first and second reflective facets to said at least one waveguide through substantially nonreflective top and bottom surfaces of said semiconductor body, said amplified lightwaves reflected vertically out of said at least one waveguide being unguided within said semiconductor body, any light reflected by said substantially nonreflective top and bottom surfaces or by any intervening layer interface of said semiconductor body having a very low probability of being recoupled back into said waveguide, thereby suppressing self-oscillation, wherein said first and second facets are approximately parallel to one another, whereby coupling of said received and emitted lightwaves with said waveguide is through two opposite top and bottom surfaces of said semiconductor body, and bias means for applying an electrical forward bias to said semiconductor body and injecting current through said active gain region to cause said lightwave amplification.

16. A fiber coupled amplifier array comprising
a semiconductor optical amplifier having a plurality of semiconductor layers disposed on a substrate with an active gain region and adjacent cladding layers therein forming a plurality of laterally spaced apart waveguides for guiding propagation of and amplifying lightwaves received thereby, wherein said optical amplifier includes angled facets formed through said plurality of semiconductor layers and interrupting each of said plurality of laterally spaced apart waveguides to form a plurality of laterally spaced apart waveguides to form a plurality of waveguide segments disposed end-to-end in tandem with said angled facets therebetween, said waveguide segments being optically isolated from one another, said angled facets positioned at an end of said waveguide segments so as to reflectively coupled light vertically between said waveguides and a substantially nonreflective top or bottom surface of said semiconductor amplifier, light vertically reflected out of said waveguide segments being unguided within said semiconductor amplifier, any light reflected by said substantially nonreflective top or bottom surface or by any intervening layer interface of said amplifier having a very low probability of being recoupled back into said waveguide segments, thereby suppressing self-oscillation, said amplifier also having bias means for applying an electrical forward bias thereto and injecting current through said active gain region to cause said amplifying of said lightwaves in said waveguide segments, and a plurality of optical fiber waveguides coupled to said surface of said semiconductor amplifier, each of said waveguide segments being surface coupled at both ends by said angled facets to a pair of optical fiber waveguides associated with each waveguide segment, one of said pair of optical fiber waveguides transmitting light into said associated waveguide segment of said amplifier, the other of said pair of optical fiber waveguides receiving amplified light coupled out of said associated waveguide segment of said amplifier.

17. The fiber coupled amplifier array of claim 16 wherein each of said angled reflective facets is oriented at a 45° angle with respect to light propagation in said waveguide segments of said amplifier.

* * * * *

UNITED STATES PATENT AND TRADEMARK OFFICE
CERTIFICATE OF CORRECTION

PATENT NO. : 5,282,080
DATED : January 25, 1994
INVENTOR(S) : Donald R. Scifres et al.

It is certified that error appears in the above-indentified patent and that said Letters Patent is hereby corrected as shown below:

Column 3, lines 17-18, "ligh-twaves" should read -- lightwaves --.

Column 3, line 20, "heterostruoture" should read -- heterostructure --.

Column 6, line 37, "bun-dle" should read -- bundle --.

Column 6, lines 49-50, "Ligh-twaves" should read -- Lightwaves --.

Column 7, line 20, "wavequide 115 to wavequide 130" should read -- waveguide 115 to waveguide 130 --.

Column 7, line 51, "$A_1$, $A_2$ and $A_3$" should read -- $\Lambda_1$, $\Lambda_2$ and $\Lambda_3$ --.

Claim 1, column 9, lines 13-14; Claim 6, column 9, lines 67-68; Claim 8, column 10, lines 5-6; Claim 10, column 10, lines 53-54; Claim 13, column 11, lines 35-36; and Claim 15, column 12, lines 17-18, "ligh-twave" should read -- lightwave --.

UNITED STATES PATENT AND TRADEMARK OFFICE
CERTIFICATE OF CORRECTION

PATENT NO. : 5,282,080
DATED : January 25, 1994
INVENTOR(S) : Donald R. Scifres et al.

It is certified that error appears in the above-indentified patent and that said Letters Patent is hereby corrected as shown below:

Claim 10, column 10, lines 21-22; and Claim 15, column 11, lines 62-63, "ligh-twaves" should read -- lightwaves --.

Claim 16, column 12, lines 29-30, "laterally spaced apart waveguides to form a plurality of laterally spaced apart waveguides to form a" should read -- laterally spaced apart waveguides to form a --.

Signed and Sealed this

Twelfth Day of July, 1994

Attest:

BRUCE LEHMAN

*Attesting Officer*     *Commissioner of Patents and Trademarks*